United States Patent [19]

Tseng

[11] Patent Number: 5,899,716
[45] Date of Patent: May 4, 1999

[54] OXYGEN ION IMPLANTATION PROCEDURE TO INCREASE THE SURFACE AREA OF AN STC STRUCTURE

[75] Inventor: Horng-Huei Tseng, Hsinchu, Taiwan

[73] Assignee: Vanguard International Semiconductor Corporation, Hsin-Chu, Taiwan

[21] Appl. No.: 08/861,313

[22] Filed: May 19, 1997

[51] Int. Cl.[6] .................................................. H01L 21/8242
[52] U.S. Cl. ............................................................ 438/254
[58] Field of Search ...................................... 438/238–239, 438/253–256, 381, 396–399

[56] References Cited

U.S. PATENT DOCUMENTS

| | | | |
|---|---|---|---|
| 5,077,225 | 12/1991 | Lee | 437/24 |
| 5,429,980 | 7/1995 | Yang et al. | 437/52 |
| 5,604,146 | 2/1997 | Tseng | 437/52 |
| 5,656,532 | 8/1997 | Tseng | 438/253 |

*Primary Examiner*—Joni Y. Chang
*Attorney, Agent, or Firm*—George O. Saile; Stephen B. Ackerman

[57] ABSTRACT

A method of creating an STC structure, used for high density, DRAM designs, has been developed. The process consists of creating a storage node electrode, for the STC structure, with increased surface area, resulting from the formation of protruding polysilicon shapes. The protruding polysilicon shapes are obtained using dielectric regions as a mask during a selective, anisotropic RIE procedure, used to define the storage node electrode shape. The dielectric regions are created via oxygen ion implantation into exposed regions of a polysilicon layer. An anneal is used to convert the oxygen implanted polysilicon regions, to dielectric regions.

21 Claims, 4 Drawing Sheets

OXYGEN ION IMPLANTATION PROCEDURE TO INCREASE THE SURFACE AREA OF AN STC STRUCTURE

BACKGROUND OF THE INVENTION (1) Field of the Invention

The present invention relates to methods used for fabrication of high density, semiconductor memory cells, and more specifically to a process used to create a stacked capacitor, DRAM structure, with increased capacitance resulting from an increased surface capacitor surface area.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, and thus limiting the amount of area the overlying STC structure can occupy, without interfering with neighboring cells.

Solutions to the shrinking design area, assigned to STC structures, have been addressed via novel semiconductor fabrication processes which result in an increase in surface area for only the lower, or storage node electrode, of the STC structure, while maintaining the area original design area of the STC structure. One method for achieving this objective been accomplished by creating lower electrodes with pillars, or protruding polysilicon shapes, thus resulting in a greater electrode surface area then would have been achieved with conventional flat surfaces. This invention will describe a process for fabricating a lower electrode shape, or storage node electrode, of an STC structure, comprised of the protruding polysilicon shapes needed to increase surface area. However this invention will describe a novel fabrication process, featuring an oxygen ion implantation procedure, used to create the dielectric masking material used to define the protruding polysilicon shapes, of the lower electrode structure. Prior art such as Lee, in U.S. Pat. No. 5,077,225, describes an oxygen ion implantation process, as part of a fabrication sequence used to create a stacked capacitor structure. However the Lee invention uses the oxygen implanted material as part of the capacitor, where the present invention uses an oxygen implanted region of polysilicon as a mask to define a storage node shape.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to create a storage node electrode featuring a flat, bottom polysilicon shape, with narrow, protruding polysilicon shapes, extending upwards from the flat, bottom polysilicon shape.

It is yet another object of this invention to define the narrow, protruding polysilicon shapes, via a selective anisotropic, reactive ion etching, (RIE), procedure, using a dielectric shape as a mask.

It is still yet another object of this invention to create the dielectric shape, used as a mask to define the narrow, protruding polysilicon shapes, via oxygen ion implantation into a polysilicon region, followed by an anneal procedure, used to convert the oxygen implanted polysilicon region to a dielectric shape.

In accordance with the present invention a method for fabricating increased capacitance DRAM devices, via use of an STC structure, comprised of a storage node electrode with increased surface area, has been developed. A transfer gate transistor comprised of: a thin gate insulator; a polysilicon gate structure; lightly doped source and drain regions; insulator spacers on the sidewalls of the polysilicon gate structure; and heavily doped source and drain regions; is formed on a semiconductor substrate. An insulator layer is deposited and a storage node contact hole is opened in the insulator layer, exposing the source and drain region of the transfer gate transistor. A polysilicon layer is deposited on top surface of the insulator layer, completely filling the storage node contact hole. A photoresist layer, with a first diameter opening, is used to allow a shallow trench to be formed within the polysilicon layer, via an anisotropic RIE procedure, exposing a flat, bottom portion of the polysilicon layer. An isotropic oxygen plasma is next used to create a second diameter opening in the photoresist layer, wider in diameter then the first opening, thus exposing sections of the top surface of the polysilicon layer, previously protected by the untreated photoresist layer. An ion implantation procedure is next used to place oxygen ions in sections of the polysilicon layer, exposed in the wider diameter opening in the photoresist layer, while also placing oxygen ions in the top surface of the flat, bottom portion of the polysilicon layer. After removal of the photoresist layer, an anneal procedure is performed to convert the polysilicon regions, implanted with oxygen, to dielectric regions. The dielectric regions are then used as a mask to allow a selective, anisotropic RIE procedure, to create the storage node electrode shape, in the polysilicon layer, featuring protruding polysilicon shapes, capped with masking dielectric regions, and a flat, bottom portion of polysilicon, again capped with a dielectric shape, and contacting the source and drain region, in the bottom of the storage node contact hole. Removal of the dielectric shapes is followed by formation of a capacitor dielectric layer, on the storage node electrode. An upper polysilicon electrode is then formed, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a lower electrode, comprised of protruding polysilicon shapes, on a flat, bottom polysilicon shape, will now be described. The transfer gate transistor, used for this DRAM device, in this invention, will be an N channel device. However the STC structure, with the increased surface area described in this invention, can also be applied to P channel, transfer gate transistor.

Figure 1:
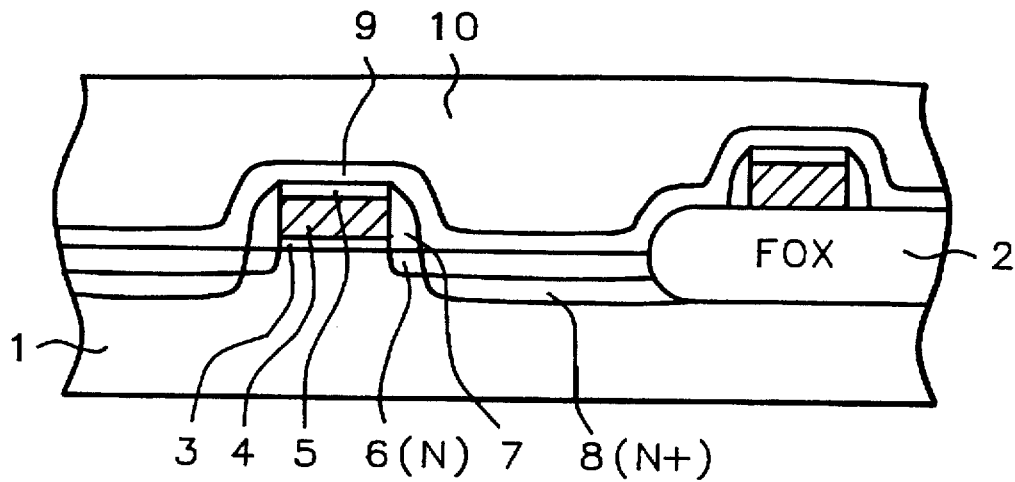
FIGS. 1–8, which schematically shows, in cross-sectional style, the key fabrication stages used in the creation of a DRAM device, with a STC structure, with an increased surface area, resulting from a storage node electrode featuring protruding polysilicon shapes.

Referring to FIG. 1, a P type, semiconductor substrate, 1, with a <100>, single crystalline orientation,is used. A field oxide, (FOX), region 2, is used for purposes of isolation. Briefly the FOX region 2, is formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX region 2, from growing on areas of substrate 1, to be used for subsequent device regions. After the growth of the FOX region 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam ambient, at a temperature between about 850 to 1050° C., to a thickness between about 50 to 200 Angstroms. A first polysilicon layer 4, is next deposited using low pressure chemical vapor deposition, (LPCVD), procedures, at a temperature between about 500 to 700° C., to a thickness between about 1500 to 4000 Angstroms. Polysilicon layer 4, can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A capping, silicon oxide 5, is next deposited on polysilicon layer 4, via either LPCVD or plasma enhanced chemical vapor deposition, (PECVD), procedures, at a temperature between about 400 to 700° C., to a thickness between about 800 to 1600 Angstroms. Conventional photolithographic and reactive ion etching, (RIE), procedures, using CHF$_3$ as an etchant for capping silicon oxide layer 5, and using Cl$_2$ as an etchant for polysilicon layer 4, are used to create a polysilicon gate structure, shown schematically in FIG. 1. Photoresist removal is accomplished via plasma oxygen ashing and careful wet cleans.

A lightly doped source and drain region 6, is next formed via ion implantation of phosphorous, at an energy between about 20 to 50 KeV, at a dose between about 1E13 to 1E14 atoms/cm$^2$. A sidewall insulator layer, of silicon oxide, is then deposited using either LPCVD or PECVD procedures, at a temperature between about 400 to 700° C., to a thickness between about 1500 to 4000 Angstroms, followed by an anisotropic RIE procedure, using CHF$_3$ as an etchant, creating insulator spacer 7, on the sidewalls of the polysilicon gate structure. A heavily doped source and drain region 8, is then formed via ion implantation of arsenic, at an energy between about 30 to 80 KeV, at a dose between about 1E15 to 1E16 atoms/cm$^2$. The result of these procedures are again schematically shown in FIG. 1.

A first interlevel insulator layer 9, of undoped silicon oxide, is next deposited using LPCVD or PECVD procedures, at a temperature between about 400 to 700° C., to a thickness between about 1000 to 3000 Angstroms. A second interlevel insulator layer 10, comprised of borophosphosilicate, (BPSG), is next deposited using PECVD procedures, at a temperature between about 400 to 700° C., to a thickness between about 3000 to 8000 Angstroms. Planarization of BPSG is performed using chemical mechanical polishing procedures, to create the smooth topography, shown schematically, once again in FIG. 1.

Figure 2:
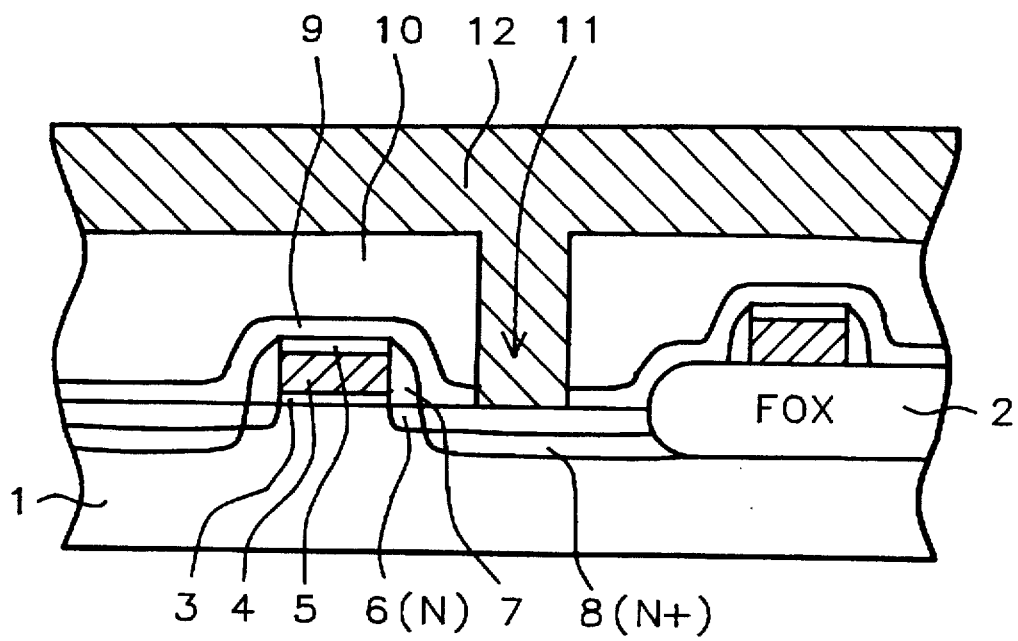

Conventional photolithographic and RIE procedures, using CHF$_3$ as an etchant, are used to open contact hole 11, in second interlevel insulator layer 10, and in the first interlevel insulator layer 9, exposing the top surface of heavily doped source and drain region 8. Contact hole 11, will be subsequently used as the storage node contact hole. Photoresist removal is performed via use of plasma oxygen ashing and careful wet cleans. A second layer of polysilicon 12, is next deposited, via LPCVD procedures, at a temperature between about 500 to 700° C., to a thickness between about 4000 to 10000 Angstroms. Polysilicon layer 12, can be deposited intrinsically and doped via ion implantation of either phosphorous or arsenic, or polysilicon layer 12, can be deposited using in situ doping procedures, via the addition of either phosphine or arsine, to a silane ambient. For both options, polysilicon layer 12, exhibits an N type, surface concentration of between about 1E20 to 1E21 atoms/cm$^3$. The result of contact hole 11, formation, and deposition of polysilicon layer 12, are schematically shown in FIG. 2.

Figure 3:
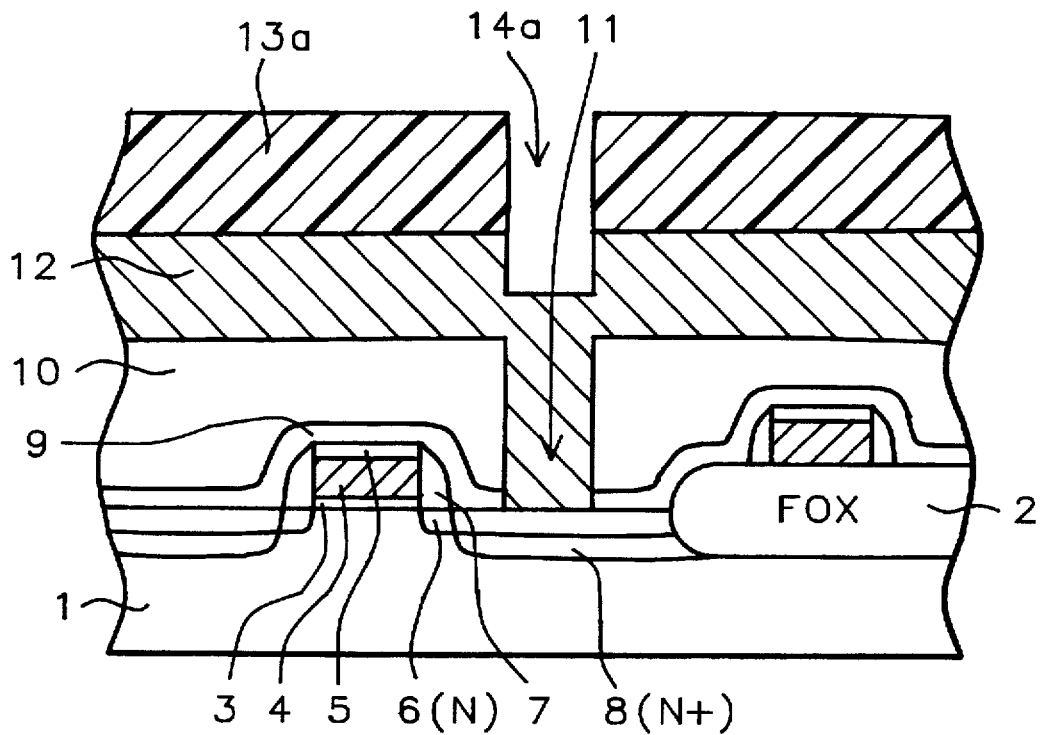
Figure 4:
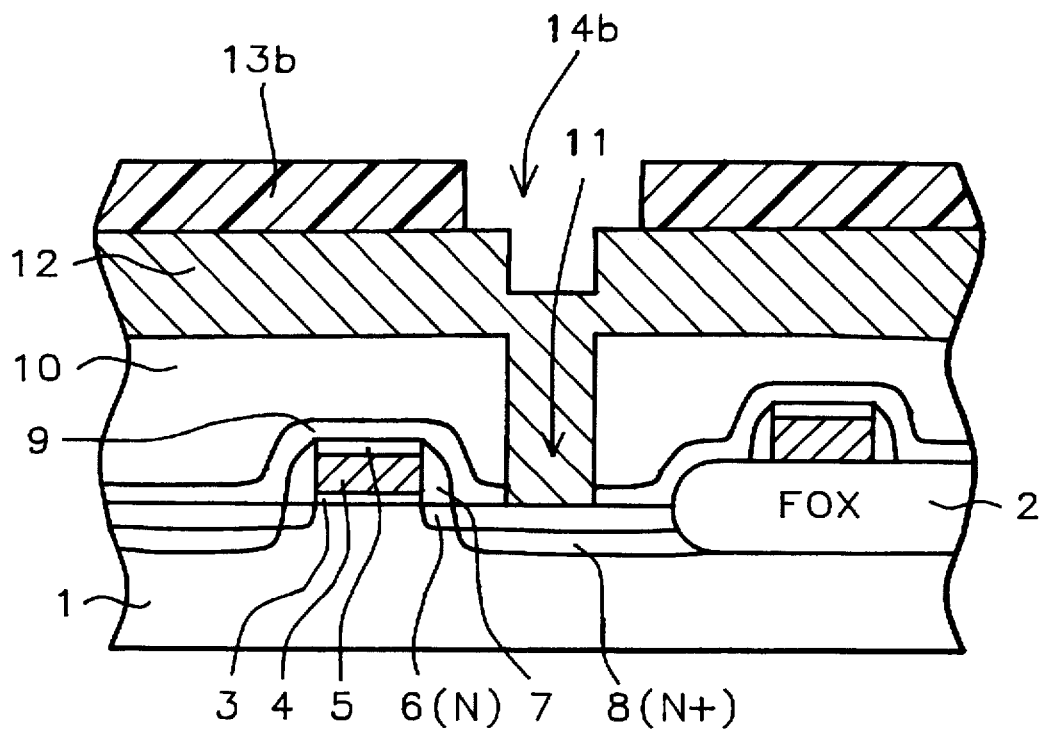

A photoresist shape 13a, is next applied, with a first opening 14a. Photoresist layer 13a, is then used as a mask to allow the first opening 14a, to be transferred to the underlying polysilicon layer 12, via anisotropic RIE procedures, using Cl$_2$ as an etchant. The RIE procedure results in the removal of between 3000 to 9000 Angstroms of polysilicon, leaving a shallow trench, at a depth between about 1000 to 2000 Angstroms, within polysilicon layer 12. This is schematically shown in FIG. 3. A critical, isotropic oxygen plasma procedure is then applied, widening first opening 14a, in photoresist shape 13a, while also thinning photoresist shape 13a, resulting in the creation of photoresist shape 13b, featuring second opening 14b, now in photoresist shape 13b, thus exposing the top surface polysilicon layer 12, in regions where the top surface of polysilicon layer 12, had previously been covered by photoresist shape 13a. This is shown schematically in FIG. 4.

Figure 5:
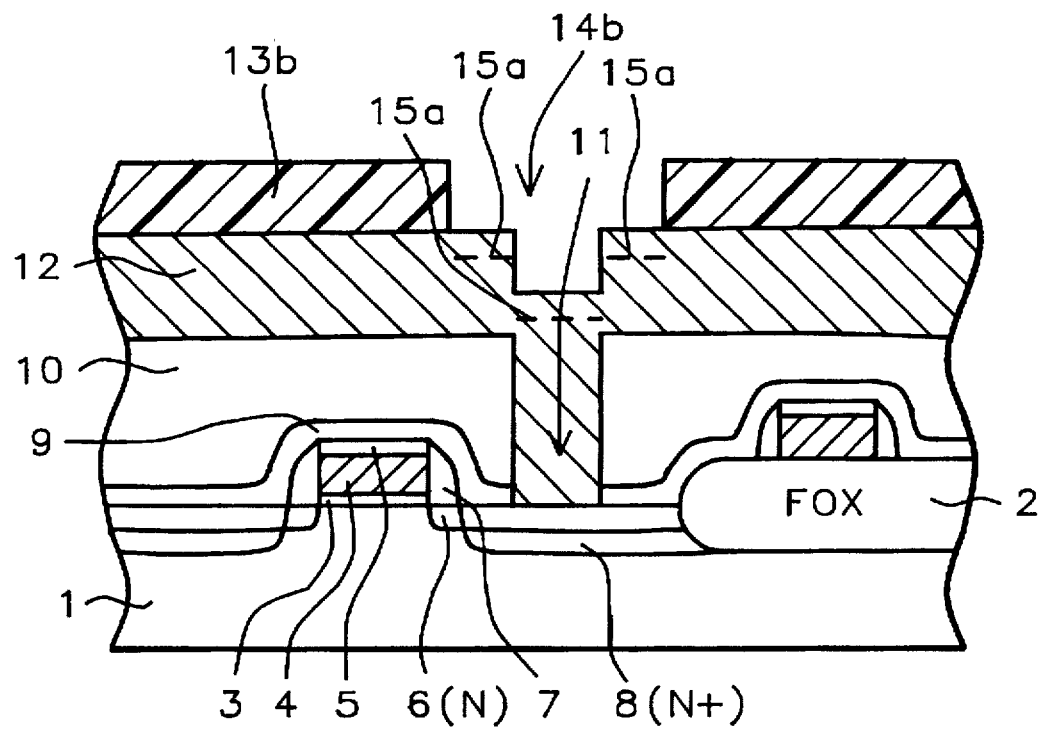
Figure 6:
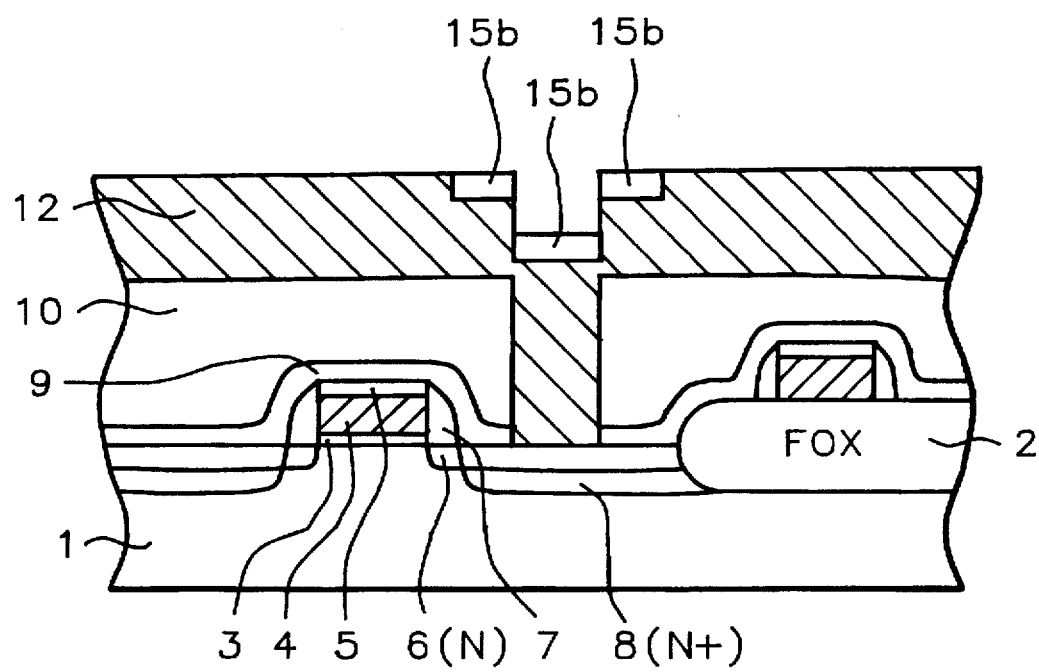
Figure 7:
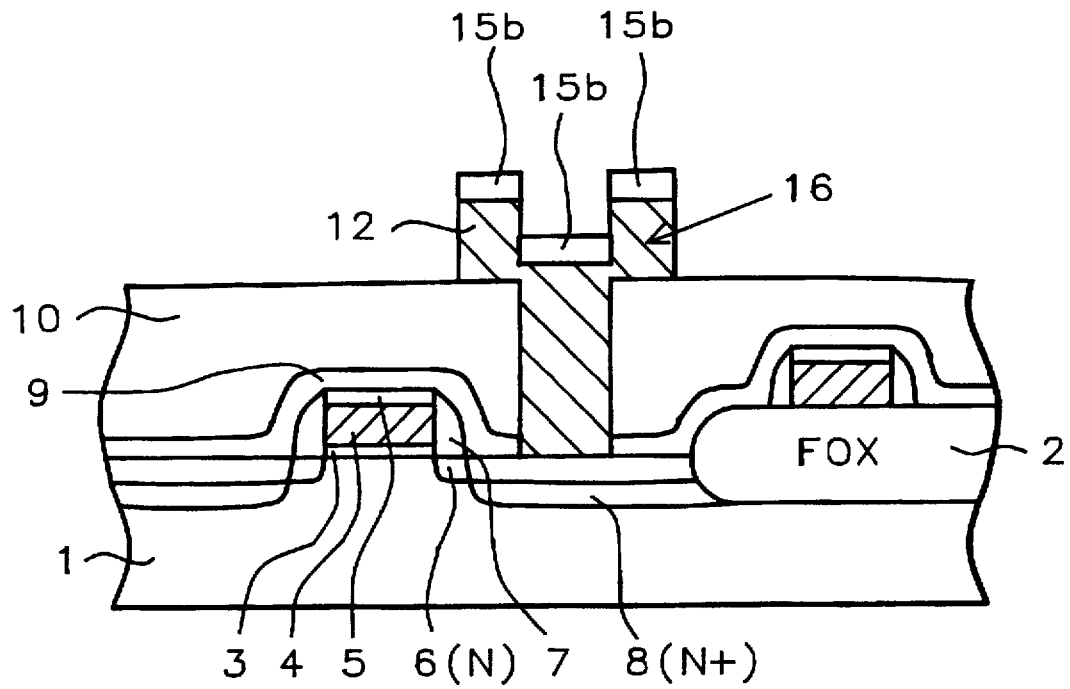

An ion implantation of oxygen is next performed, at a zero degree angle. Oxygen ions, 15a, are placed in exposed areas of polysilicon layer 12, that is regions exposed in second opening 14b, in photoresist shape 13b. This is shown schematically in FIG. 5. After removal of photoresist shape 13b, via plasma oxygen ashing and careful wet cleans, an anneal is performed, in an nitrogen or argon ambient, to create dielectric regions 15b, in areas of polysilicon layer 12, subjected to the oxygen ion implantation procedure. This is schematically shown in FIG. 6. A selective, anisotropic RIE procedure, using HBr—SF$_6$—Cl$_2$ as an etchant, is then performed, using dielectric regions, 15b, as a mask to create bottom electrode shape, or storage node electrode 16, schematically shown in FIG. 7. The selectivity of the etch chemistry, removing polysilicon at a rate about 20 times greater then the removal rate of silicon oxide, allows dielectric regions 15b, to successfully function as an etch mask, and also does not result in attack of second insulator layer 10, at endpoint. Storage node electrode 16, is comprised of protruding polysilicon shapes, defined by the dielectric regions 15b, residing on the wider, bottom portion, of unetched polysilicon layer 12, that contacts underlying source and drain region 8.

Figure 8:
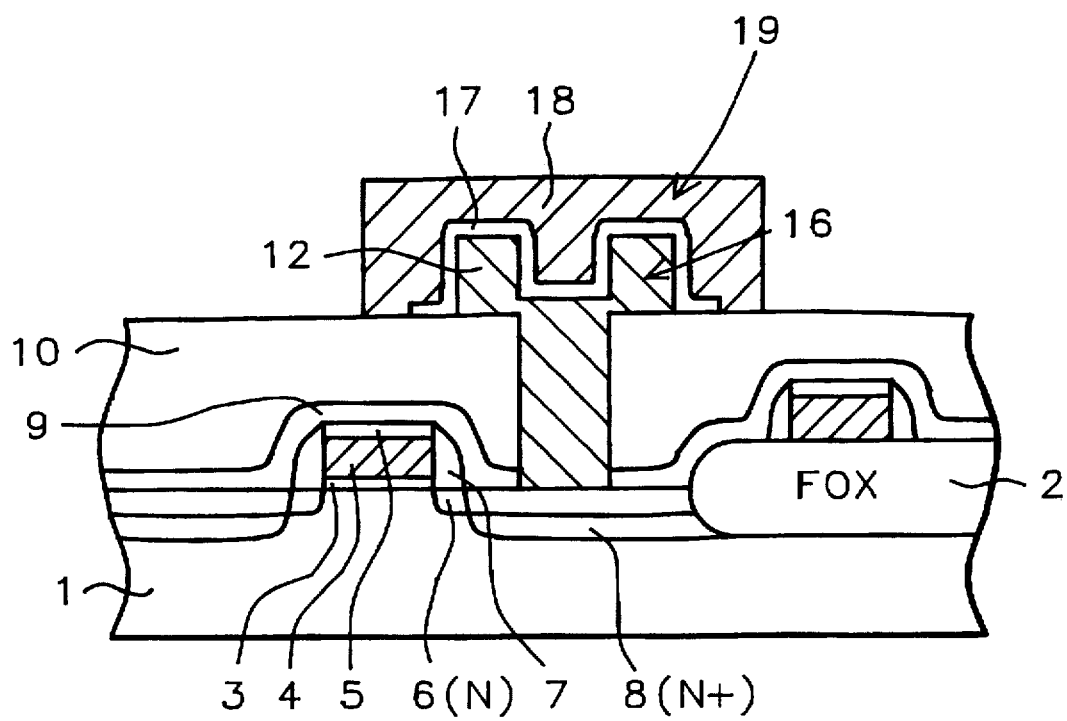

FIG. 8, schematically shows the completion of the stacked capacitor, (STC), structure. First, removal of dielectric regions 15b, is accomplished via a dilute hydrofluoric acid solution, or via use of hydrofluoric acid vapors. Next a capacitor dielectric layer 17, is formed, overlying storage node electrode 16. Capacitor dielectric layer 17, can be an insulator layer possessing a high dielectric constant, such as $Ta_2O_5$, obtained via r.f sputtering techniques, at a thickness between about 10 to 100 Angstroms. Capacitor dielectric layer 17, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of a top portion of the silicon nitride layer results in the formation of a silicon oxynitride layer on the unoxidized portion of silicon nitride, overlying the silicon oxide layer, and at a silicon oxide equivalent thickness of between about 40 to 80 Angstroms. Finally another layer of polysilicon is deposited, via LPCVD procedures, at a temperature between about 500 to 700° C., to a thickness between about 1000 to 3000 Angstroms. Doping of this polysilicon layer is accomplished via the in situ deposition procedure, again via the addition of phosphine, to a silane ambient. Photolithographic and RIE procedures, using $Cl_2$ as an etchant, are next employed to create polysilicon upper electrode, or plate electrode, 18, shown schematically in FIG. 8. The STC structure 19, shown in FIG. 8, with the increased surface area resulting from a storage node electrode, featuring protruding polysilicon shapes, offers increased capacitance when compared to counterpart STC structures, fabricated with flat storage node electrode shapes. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a dynamic random access memory, (DRAMA), device, on a semiconductor substrate, featuring a stacked capacitor (STC), structure overlying a transfer gate transistor, and with said STC structure comprised of a storage node electrode, with protruding polysilicon shapes, a capacitor dielectric layer, and an overlying upper electrode; comprising the steps of:

providing said transfer gate transistor;

depositing an insulator layer on said transfer gate transistor;

forming a storage node contact hole in said insulator layer, exposing a source and drain region of said transfer gate transistor;

forming a first polysilicon shape, completely filling said storage node contact hole, with a shallow trench located in the center of said first polysilicon shape;

selectively forming a dielectric layer on portions of said first polysilicon shape, via an oxygen ion implantation procedure, and anneal procedure;

forming the storage node electrode, of said STC structure, via selective etching of the regions of said first polysilicon shape, not covered by said dielectric layer, with said storage node electrode comprised with protruding polysilicon shapes, overlying a wider, flat, bottom polysilicon shape, which in turn contacts said source and drain region, exposed in said storage node contact;

forming said capacitor dielectric layer, of said STC structure, on said storage node electrode; and forming said upper electrode, of said STC structure, on said capacitor dielectric layer.

2. The method of claim 1, wherein said transfer gate transistor is an N channel metal oxide semiconductor field effect transistor, (MOSFET), with a silicon dioxide gate insulator layer, a polysilicon gate structure, insulator sidewall spacers, and N type source and drain regions.

3. The method of claim 1, wherein said transfer gate transistor is a P channel MOSFET, with a silicon dioxide gate insulator layer, a polysilicon gate structure, insulator sidewall spacers, and P type source and drain regions.

4. The method of claim 1, wherein said storage node contact hole is formed, via anisotropic reactive ion etch, (RIE), procedures, using $CHF_3$ as an etchant, in a composite insulator layer, comprised of an overlying borophosphosilicate, (BPSG), layer, at a thickness between about 3000 to 8000 Angstroms, and an underlying silicon oxide layer, at a thickness between about 1000 to 2000 Angstroms.

5. The method of claim 1, wherein said storage node electrode, of said STC structure, is formed from a a polysilicon layer, obtained via N type, in situ doping, low pressure chemical vapor deposition, (LPCVD), procedures, with a N type surface concentration between about 1E20 to 1E21 atoms/cm$^3$.

6. The method of claim 1, wherein said storage node electrode, of said STC structure, is comprised of said protruding polysilicon shapes, on said underlying, wider, flat polysilicon shape.

7. The method of claim 1, wherein said protruding polysilicon shapes are formed by patterning of a polysilicon layer, via a selective, anisotropic RIE procedure, using HBr—$SF_6$—$Cl_2$ as an etchant, and using a overlying dielectric shape as a mask.

8. The method of claim 7, wherein said dielectric shape, used as a mask to define said protruding polysilicon shapes, is obtained via said oxygen ion implantation procedure, using a zero degree implantation angle, followed by an anneal, in a nitrogen, or in an argon ambient.

9. The method of claim 1, wherein said capacitor dielectric layer is composed of silicon oxynitride silicon—nitride—silicon oxide, (ONO), obtained by thermal oxidation of a top surface of said storage node electrode, to form a silicon oxide layer, between about 10 to 50 Angstroms, followed by a deposition of silicon nitride, to a thickness between about 10 to 20 Angstroms, and thermal oxidation of a top portion of said silicon nitride layer, creating a silicon oxynitride layer, on the unoxidized silicon nitride layer, overlying said silicon oxide layer.

10. The method of claim 1, wherein said upper electrode, of said STC structure, is a doped polysilicon structure, formed from a LPCVD polysilicon layer, at a thickness between about 1000 to 3000 Angstroms, and patterned using anisotropic RIE procedures, using $Cl_2$ as an etchant.

11. A method for fabricating a stacked capacitor structure, (STC), overlying a transfer gate transistor structure, for a DRAM device, in which a surface area of a storage node electrode is increased by formation of protruding polysilicon shapes, comprising the steps of:

depositing an interlevel composite insulator layer on said transfer gate transistor;

opening a storage node contact hole in said interlevel composite insulator layer, exposing a source and drain region, in a bottom of said storage node contact hole;

depositing a polysilicon layer on a top surface of said interlevel composite insulator layer, and completely filling said storage node contact hole;

forming a first photoresist shape, with a first opening, on said polysilicon layer;

removing a portion of said first polysilicon layer, defined by said first opening, resulting in shallow trench within said polysilicon layer;

plasma treating said first photoresist shape to create a second photoresist shape, with a second opening, in said second photoresist shape, with said second opening wider in diameter than said first opening, and exposing the top surface of said polysilicon layer, in regions in which said top surface of said polysilicon layer was previously protected by said first photoresist shape;

ion implanting oxygen into exposed regions of said polysilicon layer;

removal of said second photoresist shape;

annealing to create dielectric regions, in regions of polysilicon containing oxygen ions;

selective, anisotropic etching of said polysilicon layer, not covered by said dielectric regions, to create said storage node electrode, with narrow, protruding polysilicon shapes, extending upwards from a wider, flat, bottom polysilicon shape;

forming a capacitor dielectric layer on said storage node electrode; and forming a polysilicon, upper electrode, for said STC structure.

12. The method of claim 11, wherein said interlevel composite insulator layer is comprised of an underlying silicon oxide layer, deposited using LPCVD or plasma enhanced chemical vapor deposition, (PECVD), procedures, at a temperature between about 400 to 700° C., to a thickness between about 1000 to 2000 Angstroms, and an overlying BPSG layer, deposited using PECVD procedures, at a temperature between about 400 to 700° C., to a thickness between about 3000 to 8000 Angstroms.

13. The method of claim 11, wherein said storage node contact hole is formed in said interlevel composite layer via RIE procedures, using $CHF_3$ as an etchant.

14. The method of claim 11, wherein said polysilicon layer is obtained via LPCVD procedures, at a temperature between about 500 to 700° C., to a thickness between about 3000 to 8000 Angstroms, with said polysilicon layer having an N type surface concentration between about 1E20 to 1E21 atoms/$cm^3$, obtained from either LPCVD in situ doping procedures, or via ion implantation of arsenic or phosphorous, into an intrinsically grown polysilicon layer.

15. The method of claim 11, in which said shallow trench within said polysilicon layer, is created to a depth between about 1000 to 3000 Angstroms, via anisotropic RIE procedures, using $Cl_2$ as an etchant.

16. The method of claim 11, wherein said second opening, in said second photoresist shape, is created via an isotropic plasma treatment, using oxygen as a reactant.

17. The method of claim 11, wherein oxygen ion implantation procedure, is performed at a zero degree implantation angle.

18. The method of claim 11, wherein annealing used to create dielectric regions, in regions of said polysilicon layer containing oxygen, is performed in a nitrogen, or in an argon ambient.

19. The method of claim 11, wherein said storage node electrode is formed via selective, anisotropic RIE of said polysilicon layer, using HBr—$SF_6$—$Cl_2$ as an etchant.

20. The method of claim 11, wherein said capacitor dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing the top portion of said silicon nitride layer to from a silicon oxynitride layer on the bottom portion of said silicon nitride layer, overlying said thin silicon oxide layer.

21. The method of claim 11, wherein said upper electrode, of said STC structure is formed from a doped polysilicon layer, deposited using LPCVD procedures to a thickness between about 1000 to 3000 Angstroms, and patterned via anisotropic RIE procedures, using $Cl_2$ as an etchant.

* * * * *